United States Patent
Huang et al.

(10) Patent No.: US 10,141,530 B2
(45) Date of Patent: Nov. 27, 2018

(54) THIN FILM TRANSISTOR AND MANUFACTURING METHOD THEREOF, ARRAY SUBSTRATE, AND DISPLAY APPARATUS

(71) Applicants: BOE TECHNOLOGY GROUP CO., LTD., Beijing (CN); SHANGHAI JIAO TONG UNIVERSITY, Shanghai (CN)

(72) Inventors: Wei Huang, Beijing (CN); Jiaqing Zhao, Beijing (CN); Wei Tang, Beijing (CN); Linrun Feng, Beijing (CN); Xiaojun Guo, Beijing (CN)

(73) Assignees: BOE TECHNOLOGY GROUP CO., LTD., Beijing (CN); SHANGHAI JIAO TONG UNIVERSITY, Shanghai (CN)

( * ) Notice: Subject to any disclaimer, the term of this patent is extended or adjusted under 35 U.S.C. 154(b) by 0 days.

(21) Appl. No.: 15/110,091

(22) PCT Filed: Nov. 5, 2015

(86) PCT No.: PCT/CN2015/093876
§ 371 (c)(1),
(2) Date: Jul. 6, 2016

(87) PCT Pub. No.: WO2016/201864
PCT Pub. Date: Dec. 22, 2016

(65) Prior Publication Data
US 2017/0149003 A1 May 25, 2017

(30) Foreign Application Priority Data
Jun. 16, 2015 (CN) .......................... 2015 1 0335120

(51) Int. Cl.
*H01L 51/00* (2006.01)
*H01L 35/24* (2006.01)
(Continued)

(52) U.S. Cl.
CPC ........ *H01L 51/107* (2013.01); *H01L 51/0055* (2013.01); *H01L 51/0541* (2013.01);
(Continued)

(58) Field of Classification Search
CPC .............. H01L 51/105; H01L 51/0541; H01L 51/0545; H01L 51/107; H01L 51/0055; H01L 51/0558
(Continued)

(56) References Cited

U.S. PATENT DOCUMENTS

2007/0090352 A1* 4/2007 Ahn ....................... B82Y 10/00
257/40
2008/0048183 A1* 2/2008 Ohsawa .............. H01L 27/3274
257/40
(Continued)

FOREIGN PATENT DOCUMENTS

CN 1495931 A 5/2004
CN 101116187 A 1/2008
(Continued)

OTHER PUBLICATIONS

Jeon et al., The origin of hole injection improvements with MoO3/Al bilayer electrodes in pentacene thin-film transistors, Sep. 13, 2009, Synthetic Materials, 159, p. 2502-2505.*
(Continued)

*Primary Examiner* — Lex Malsawma
*Assistant Examiner* — Nduka Ojeh
(74) *Attorney, Agent, or Firm* — Kinney & Lange, P.A.

(57) ABSTRACT

This invention provides a thin film transistor and a manufacturing method thereof, an array substrate, and a display
(Continued)

apparatus. This thin film transistor comprises an organic semiconductor layer and a source drain electrode layer, and further comprises a metal oxide insulating layer, wherein the metal oxide insulating layer is provided between the organic semiconductor layer and the source drain electrode layer and has a work function higher than that of the source drain electrode layer. In the thin film transistor provided by this invention, the metal oxide insulating layer having a higher work function can generate an interface dipole barrier so as to reduce the difficulty for the carriers in the source drain electrode to enter the organic semiconductor layer and thereby it is possible to decrease the contact resistance between the source drain electrode layer and the semiconductor layer and improve electrical properties of the thin film transistor.

16 Claims, 2 Drawing Sheets

(51) Int. Cl.
*H01L 29/08* (2006.01)
*H01L 51/10* (2006.01)
*H01L 51/05* (2006.01)

(52) U.S. Cl.
CPC ........ *H01L 51/105* (2013.01); *H01L 51/0558* (2013.01); *H01L 2251/303* (2013.01)

(58) Field of Classification Search
USPC ................ 257/40, 43; 438/104, 34, 785, 99
See application file for complete search history.

(56) References Cited

U.S. PATENT DOCUMENTS

2010/0051911 A1    3/2010   Cho et al.
2010/0301311 A1*  12/2010   Oku ................... H01L 51/0529
                                                         257/40
2013/0161602 A1*   6/2013   James ................ H01L 51/0021
                                                         257/40

FOREIGN PATENT DOCUMENTS

CN    102856494 A    1/2013
CN    102959756 A    3/2013
CN    104218151 A   12/2014

OTHER PUBLICATIONS

Chu, Chih-Wei, "High-Performance Organic Thin-Film Transistors with Metal Oxide/Metal Bilayer Electrode," Applied Physics Letter, No. 87, 2005, 4 pages.
Oyamada, Takahito, "Lateral Organic Light-Emitting Diode with Field-Effect Transistor Characteristics", Journal of Applied Physics, No. 98, 2005, 8 pages.
Jeon, Pyungeun, "The Origin of Hole Injection Improvements with MoO3/Al Bilayer Electrodes in Pentacene Thin-Film Transistors", Synthetic Metals, No. 159, 2009, 4 pages.
First Chinese Office Action, for Chinese Patent Application No. 201510335120.1, dated Mar. 2, 2017, 18 pages.
International Search Report and Written Opinion (including English translation of Box V) dated Mar. 21, 2016, for rresponding PCT Application No. PCT/CN2015/093876.
Second Chinese Office Action, for Chinese Patent Application No. 201510335120.1, dated May 5, 2017, 14 pages.
Third Chinese Office Action, for Chinese Patent Application No. 201510335120.1, dated Aug. 3, 2017, 15 pages.
Fourth Chinese Office Action, for Chinese Patent Application No. 201510335120.1, dated Nov. 27, 2017, 8 pages.

* cited by examiner

THIN FILM TRANSISTOR AND MANUFACTURING METHOD THEREOF, ARRAY SUBSTRATE, AND DISPLAY APPARATUS

FIELD OF THE INVENTION

This disclosure relates to the technical field of display, and particularly to an organic thin film transistor and a manufacturing method thereof, an array substrate, and a display apparatus.

BACKGROUND OF THE INVENTION

With the development of the technologies of display manufacture, the liquid crystal display technology has been rapidly developed, and has substituted the conventional cathode ray tube displays and becomes the mainstream of flat panel displays in the future. In the technical field of liquid crystal displays, the thin film transistor liquid crystal display (TFT-LCD) has been widely used in the fields of televisions, computers or the like by virtue of its advantages of large size, high integration level, powerful function, flexible process, low cost, or the like.

Compared to the conventional thin film transistors, the organic thin film transistor has a less manufacturing cost and has a wider application value. However, since an organic material is used as a semiconductor layer in an organic thin film transistor, it is relatively difficult for the carriers of the source drain electrode to enter the semiconductor layer, which results in excessively large contact resistance between the source drain electrode and the semiconductor layer and reduces electrical properties of the thin film transistor.

SUMMARY OF THE INVENTION

An object of this disclosure is to overcome the problem described above.

In a first aspect, this disclosure provides a thin film transistor, comprising an organic semiconductor layer and a source drain electrode layer, characterized by further comprising a metal oxide insulating layer, wherein the metal oxide insulating layer is provided between the organic semiconductor layer and the source drain electrode layer and the metal oxide insulating layer has a work function higher than that of the source drain electrode layer.

Further, the metal oxide insulating layer has a thickness between 0.1 nm and 10 nm.

Further, the material of the source drain electrode layer is copper, aluminum, zinc, or silver, and the material of the metal oxide insulating layer is molybdenum oxide, nickel oxide, tungsten oxide, or vanadium pentoxide.

Further, the material of the organic semiconductor layer is pentacene, 6,13-bis(triisopropylsilylethynyl)pentacene, a fullerene derivative, poly(3-hexylthiophene), a polythiophene derivative, or a small-molecule thiophene derivative.

Further, the thin film transistor further comprises a transition metal layer, wherein the transition metal layer is provided between the source drain electrode layer and the metal oxide insulating layer, and the transition metal layer has a work function higher than that of the source drain electrode layer.

Further, the material of the transition metal layer is gold or platinum.

Further, the ratio of the thickness of the transition metal layer to the thickness of the source drain electrode layer is 1/2-1/10.

Further, the ratio of the thickness of the transition metal layer to the thickness of the source drain electrode layer is 1/4.

Further, the thin film transistor is a top gate type thin film transistor.

In a second aspect, this disclosure further provides a manufacturing method of the thin film transistor according to any one of those described above, comprising a step of forming an organic semiconductor layer and a source drain electrode layer, characterized by further comprising a step of forming a metal oxide insulating layer between the organic semiconductor layer and the source drain electrode layer, wherein the metal oxide insulating layer has a work function higher than that of the source drain electrode layer.

Further, the manufacturing method further comprises a step of:

forming a transition metal layer between the source drain electrode layer and the metal oxide insulating layer, wherein the transition metal layer has a work function higher than that of the source drain electrode layer.

Further, said step of forming a transition metal layer between the source drain electrode layer and the metal oxide insulating layer comprises:

forming a metal oxide insulating layer using a vacuum thermal evaporation deposition process;

forming a transition metal material layer on the metal oxide insulating layer; and subjecting the metal oxide insulating layer and the transition metal material layer to a patterning process to simultaneously form a source electrode and a drain electrode as well as a transition metal layer on the source electrode and the drain electrode.

In a third aspect, this disclosure further provides an array substrate, comprising a thin film transistor according to any one of those described above.

In a fourth aspect, this disclosure further provides a display apparatus, comprising an array substrate described above.

In the thin film transistor provided by this disclosure, a metal oxide insulating layer having a work function higher than that of the source drain electrode is provided between the organic semiconductor layer and the source drain electrode. The metal oxide insulating layer having a higher work function can generate an interface dipole barrier to reduce the difficulty for the carriers in the source drain electrode to enter the organic semiconductor layer, and thereby it is possible to decrease the contact resistance between the source drain electrode layer and the semiconductor layer, and improve the electrical properties of the thin film transistor.

DETAILED DESCRIPTION OF THE INVENTION

In order to enable the objects, technical solutions, and the advantages of the Examples of this disclosure to be clearer, the technical solutions in the Examples of this disclosure will be described clearly and fully below in conjunction with the accompanying drawings in the Examples of this disclosure. Obviously, the Examples described are merely part of the examples of this disclosure, rather than all of the examples. Based on the Examples in this disclosure, all other Examples obtained by those of ordinary skill in the art without performing inventive work belong to the scope of this disclosure.

In this disclosure, the source drain electrode layer comprises a source electrode and a drain electrode.

In a first aspect, this disclosure provides a thin film transistor. This thin film transistor comprises an organic semiconductor layer and a source drain electrode layer, and further comprises a metal oxide insulating layer, wherein the metal oxide insulating layer is provided between the organic semiconductor layer and the source drain electrode layer, and the metal oxide insulating layer has a work function higher than that of the source drain electrode layer.

In the thin film transistor provided by this disclosure, a metal oxide insulating layer having a work function higher than that of the source drain electrode is provided between the organic semiconductor layer and the source drain electrode. The metal oxide insulating layer having a higher work function can generate an interface dipole barrier to reduce the difficulty for the carriers in the source drain electrode to enter the organic semiconductor layer so as to decrease the contact resistance between the source drain electrode and the semiconductor layer and improve the electrical properties of the thin film transistor.

In a second aspect, this disclosure further provides a manufacturing method of a thin film transistor, which can be used for manufacturing the thin film transistor described above, and this method comprises a step of forming an organic semiconductor layer and a source drain electrode layer and a step of forming a metal oxide insulating layer between the organic semiconductor layer and the source drain electrode layer, wherein the metal oxide insulating layer has a work function higher than that of the source drain electrode layer.

In the specific practice, the specific structure of the thin film transistor provided by this disclosure may be plural. For example, it may be a bottom gate type thin film transistor or a top gate type thin film transistor. Furthermore, in addition to the organic semiconductor layer described above, it may typically comprise basic structures such as a gate electrode, a gate insulating layer, a pixel electrode or the like. The structure of the thin film transistor provided by this disclosure and the corresponding manufacturing method will be illustrated in detail below in conjunction with accompanying drawings.

EXAMPLE 1

Figure 1:
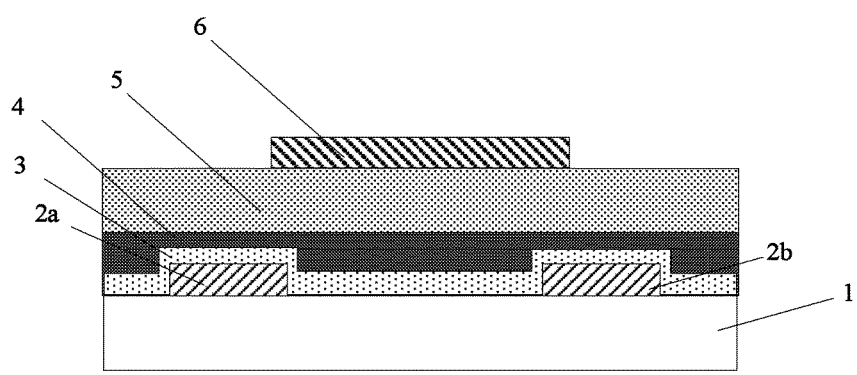
FIG. 1 is a structural schematic diagram of a thin film transistor provided by Example 1 of this disclosure.

As shown in FIG. 1, it is a structural schematic diagram of a thin film transistor provided by Example 1 of this disclosure, and this thin film transistor is a top gate type structure. In particular, it comprises: a substrate 1, a source electrode 2a and a drain electrode 2b formed on the substrate 1, a metal oxide insulating layer 3 formed on the source electrode 2a and the drain electrode 2b, an organic semiconductor layer 4 formed on the metal oxide insulating layer 3, a gate insulating layer 5 formed on the organic semiconductor layer 4, and a gate electrode 6 formed on the gate insulating layer 5.

Here, the metal oxide insulating layer 3 has a work function higher than those of the source electrode 2a and the drain electrode 2b herein. Thus, the metal oxide insulating layer 3 having a higher work function can generate an interface dipole barrier to reduce the difficulty for the carriers in the source drain electrode to enter the organic semiconductor layer, so as to decrease the contact resistance between the source drain electrode and the semiconductor layer and improve the electrical properties of the thin film transistor.

In the specific practice, the metal oxide insulating layer 3 herein may have a thickness between 0.1 nm to 10 nm. At this point, the contact resistance between the source drain electrode and the semiconductor layer can be greatly decreased. Of course, when the metal oxide insulating layer 3 herein has a thickness of other values, the contact resistance between the source drain electrode and the semiconductor layer may also be decreased to some extent, and the corresponding technical solutions should also fall in the scope of this disclosure.

Further, the material of the source drain electrode herein may be specifically a metal with a relatively low cost such as copper, aluminum, zinc, silver or the like, which is typically a metal with low energy consumption, while the material of the metal oxide insulating layer may be a material having a higher work function such as molybdenum oxide, nickel oxide, tungsten oxide, or vanadium pentoxide or the like. Thus, since copper, aluminum, zinc or silver and molybdenum oxide, nickel oxide, tungsten oxide, and vanadium pentoxide are all relatively inexpensive, the manufacturing cost of the thin film transistor can be decreased.

In the specific practice, the material of the organic semiconductor layer 4 herein may be one selected from pentacene, 6,13-bis(triisopropylsilylethynyl)pentacene (Tips-pentacene), a fullerene derivative such as [6,6]v-phenyl C61-butyric acid methyl ester (PCBM), poly(3-hexylthiophene) (P3HT), a polythiophene derivative such as poly(2,5-bis(3-tetradecylthiophen-2-yl)thieno[3,2-b]thiophene (pBTTT), and a small-molecule thiophene derivative such as 2,7-alkyl[1]benzothieno[3,2-b][1]benzothiophene (C8BTBT).

Assuming that the material of the source drain electrode is Ag while the material of the organic semiconductor layer 4 is pentacene and the metal oxide insulating layer is molybdenum oxide, an interface dipole barrier may be generated by inserting a metal oxide insulating layer between Ag and pentacene to improve the work function of metal (~0.35 eV), so as to decrease the hole injection barrier and decrease the contact resistance. As for the copper metal, it has a work function of 4.65 before the modification of molybdenum oxide and a work function of 5.3 after the modification of molybdenum oxide, and thus the increase of the work function thereof is obvious.

Figure 2:
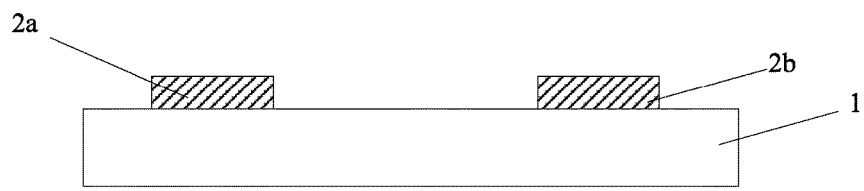
FIGS. 2-5 are manufacture flow charts of the thin film transistor provided by Example 1 of this disclosure.

The manufacturing method of the thin film transistor described above may comprise the steps of:

Step S1: a source drain electrode material layer is formed on a substrate 1 (for example, a layer of Cu metal may be deposited on a substrate 1, wherein the thickness is preferably 50 nm or less), and a patterning treatment is performed on the deposited source drain electrode material to obtain a source electrode 2a and a drain electrode 2b; the structure obtained after step S1 can be referred to FIG. 2, which comprises a substrate 1 and a source electrode 2a and a drain electrode 2b formed on the upper surface of the substrate 1.

The processes for depositing the source drain electrode material and performing the patterning process on the source drain electrode material to obtain the source electrode 2a and the drain electrode 2b can be referred to the prior art, and will not be illustrated in detail hereby.

Figure 3:
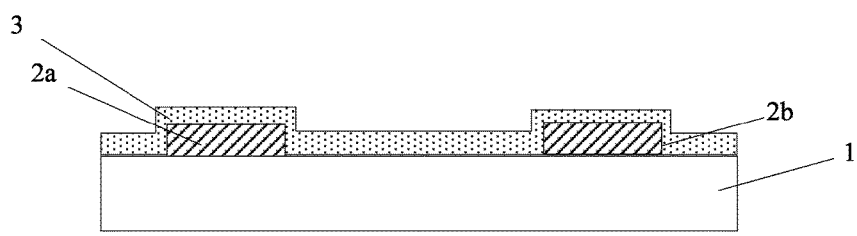

Step S2: a metal oxide insulating layer 3 is formed on the structure obtained in Step S1. In particular, a corresponding material, such as molybdenum oxide as the metal oxide insulating layer 3, may be deposited by a vacuum thermal evaporation process, and the formed metal oxide insulating layer 3 may have a thickness of 0.1-10 nm, preferably between 1-3 nm. In this process, it is not required to subject the metal oxide insulating layer 3 to a patterning process, and the formed metal oxide insulating layer 3 covers the entire substrate 1. The structure obtained after Step S2 can be referred to FIG. 3, which is different from FIG. 2 in that a metal oxide insulating layer 3 formed on the source electrode 2a and the drain electrode 2b and the substrate 1 is further comprised.

The step of depositing the metal oxide insulating layer 3 can also be referred to the prior art, and will not be illustrated in detail in this disclosure.

Figure 4:
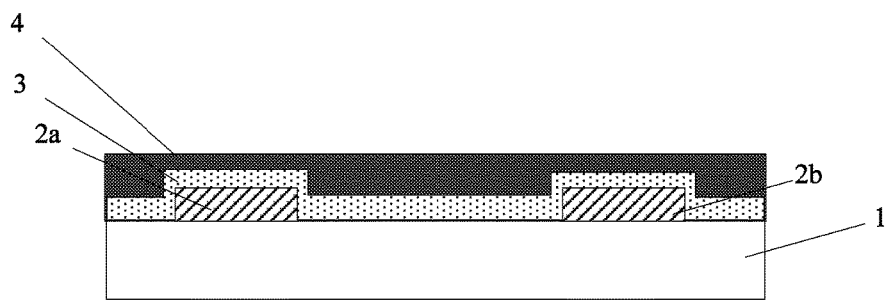

Step S3: an organic semiconductor layer 4 is formed on the structure obtained in Step S2, and may have a thickness of 50-100 nm, preferably 60-80 nm. The organic semiconductor layer 4 may be formed on the structure obtained in Step S2 by a process of deposition/spin coating/printing. The structure obtained after Step S3 can be referred to FIG. 4, which is different from FIG. 3 in that an organic semiconductor layer 4 formed on the metal oxide insulating layer 3 is further comprised.

Figure 5:
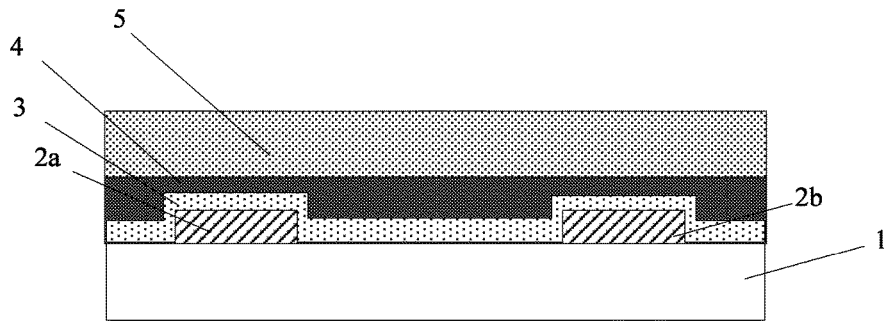

Step S4: a gate insulating layer 5 is formed on the structure obtained in Step S3, and may have a thickness of 100-1000 nm. The gate insulating layer 5 may also be formed on the structure obtained in Step S3 by a process of deposition/spin coating/printing. The structure obtained after Step S4 can be referred to FIG. 5, which is different from FIG. 4 in that a gate insulating layer 5 formed on the organic semiconductor layer 4 is further comprised.

Step S5: a gate metal layer is formed on the structure obtained in Step S4, and this gate metal layer is etched to form a gate electrode 6. The deposited gate metal may be Cu, which may have a thickness of 50 nm or less. The structure obtained after Step S5 can be referred to FIG. 1, which is different from FIG. 5 in that a gate electrode 6 formed on the gate insulating layer 5 is further comprised.

By far, the manufacture process of the organic thin film transistor in Example 1 has been accomplished.

EXAMPLE 2

Figure 6:
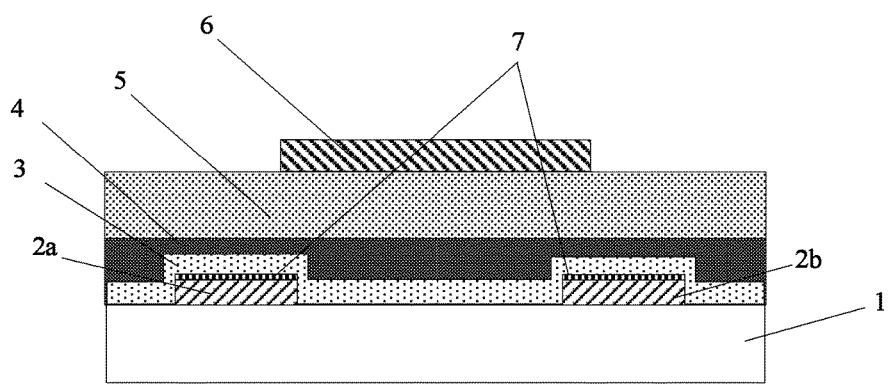
FIG. 6 is a structural schematic diagram of a thin film transistor provided by Example 2 of this disclosure.

As shown in FIG. 6, it is a structural schematic diagram of a thin film transistor provided by Example 2 of this disclosure. It is different from the structure in FIG. 1 in that the thin film transistor provided by Example 2 of this disclosure further comprises a transition metal layer 7 between the source electrode 2a, the drain electrode 2b and the metal oxide insulating layer 3. The transition metal layer 7 may also comprise two parts having the same shapes as those of the source electrode 2a and the drain electrode 2b, and this transition metal layer 7 has a work function higher than those of the source electrode 2a and the drain electrode 2b.

In particular, the material of the transition metal layer 7 herein may be gold or platinum. Further, the ratio of the thickness of the transition metal layer 7 herein to the thicknesses of the source electrode 2a and the drain electrode 2b may be 1:2-1:10, and preferably 1:4-1:6. In this way, since the transition metal layer 7 has a smaller thickness, the precious metals used for manufacturing this transition metal layer 7 can be decreased so as to reduce cost.

It will be easily understood that in the specific practice, the transition metal layer 7 described above may also cover the source electrode 2a and the drain electrode 2b in its entirety. That is, the transition metal layer 7 is also formed on each side of the source electrode 2a and the drain electrode 2b, and the contact resistance can be further decreased in this way.

The manufacturing method of the thin film transistor provided by Example 2 of this disclosure can be referred to the manufacturing method of the thin film transistor provided by Example 1, with the exception that in Step S1 described above, a transition metal material layer having a thickness which is 1:4-1:6 of that of the source drain electrode material layer is also deposited, before the source drain electrode material layer is patterned to form the source electrode 2a and the drain electrode 2b. For example, if 40 nm Cu is deposited as the source drain electrode material layer, a transition metal material layer of 10 nm may be deposited, and subsequently, the source electrode 2a and the drain electrode 2b as well as the transition metal layer 7 located on the source electrode 2a and the drain electrode 2b are simultaneously formed by a patterning process.

As tested in experiments, when a metal oxide insulating layer having a work function higher than that of the source drain electrode layer is present between the organic semiconductor layer and the source drain electrode layer, the contact resistance between the source drain electrode layer and the semiconductor layer can be significantly decreased so as to improve the electrical properties of the thin film transistor.

In a third aspect, this disclosure further provides an array substrate, which comprises the thin film transistor described above.

In a fourth aspect, this disclosure further provides a display apparatus, which comprises the array substrate according to any one of those described above. Particularly, this display apparatus may be any apparatus having the function of displaying, such as a cell phone, a computer, a television, a tablet computer or the like.

Those described above are only specific embodiments of this disclosure, but the scope of this disclosure is not limited thereto. Within the technical scope disclosed by this present disclosure, any person skilled in the art will easily conceive variations or replacements, which should be covered by the scope of this disclosure. Therefore, the scope of this disclosure should be determined by the protection scopes of the claims.

What is claimed is:

1. A thin film transistor, comprising an organic semiconductor layer and a source drain electrode layer, and further comprising a metal oxide insulating layer, wherein the metal oxide insulating layer is provided between the organic semiconductor layer and the source drain electrode layer, and the metal oxide insulating layer has a work function higher than that of the source drain electrode layer, wherein the source drain electrode layer is made of copper, aluminum, zinc, or silver, and the metal oxide insulating layer is a molybdenum oxide layer, a nickel oxide layer, a tungsten oxide layer, or a vanadium pentoxide layer, and the metal oxide insulating layer excludes organic material;

wherein the thin film transistor further comprises a transition metal layer provided between the source drain electrode layer and the metal oxide insulating layer, and the transition metal layer has a work function higher than that of the source drain electrode layer.

2. The thin film transistor according to claim 1, wherein the metal oxide insulating layer has a thickness between 0.1 nm-10 nm.

3. The thin film transistor according to claim 1, wherein the organic semiconductor layer is made of pentacene, 6,13-bis(triisopropylsilylethynyl)pentacene, a fullerene derivative, poly(3-hexylthiophene), a polythiophene derivative, or a small-molecule thiophene derivative.

4. The thin film transistor according to claim 1, wherein the transition metal layer is made of gold or platinum.

5. The thin film transistor according to claim 1, wherein a ratio of the thickness of the transition metal layer to the thickness of the source drain electrode layer is 1/2-1/10.

6. The thin film transistor according to claim 5, wherein a ratio of the thickness of the transition metal layer to the thickness of the source drain electrode layer is 1/4.

7. The thin film transistor according to claim 1, wherein the thin film transistor is a top gate type thin film transistor.

8. An array substrate, comprising a thin film transistor according to claim 1.

9. A display apparatus, comprising an array substrate according to claim 8.

10. A manufacturing method of a thin film transistor according to claim 1, comprising a step of forming an organic semiconductor layer and a source drain electrode layer, and further comprising a step of forming a metal oxide insulating layer between the organic semiconductor layer and the source drain electrode layer, wherein the metal oxide insulating layer has a work function higher than that of the source drain electrode layer;
wherein the method further comprises a step of forming a transition metal layer between the source drain electrode layer and the metal oxide insulating layer, wherein the transition metal layer has a work function higher than that of the source drain electrode layer.

11. The method according to claim 10, wherein said step of forming a transition metal layer between the source drain electrode layer and the metal oxide insulating layer comprises:
forming a metal oxide insulating layer using a vacuum thermal evaporation deposition process;
forming a transition metal material layer on the metal oxide insulating layer; and
subjecting the metal oxide insulating layer and the transition metal material layer to a patterning process to simultaneously form a source electrode and a drain electrode as well as a transition metal layer on the source electrode and the drain electrode.

12. The method according to claim 10, wherein the metal oxide insulating layer has a thickness between 0.1 nm-10 nm.

13. The method according to claim 10, wherein the organic semiconductor layer made of is pentacene, 6,13-bis(triisopropylsilylethynyl)pentacene, a fullerene derivative, poly(3-hexylthiophene), a polythiophene derivative, or a small-molecule thiophene derivative.

14. The method according to claim 10, wherein the transition metal layer is made of gold or platinum.

15. The method according to claim 10, wherein a ratio of the thickness of the transition metal layer to the thickness of the source drain electrode layer is 1/2-1/10.

16. The method according to claim 10, wherein a ratio of the thickness of the transition metal layer to the thickness of the source drain electrode layer is 1/4.

* * * * *